United States Patent
Abuelma'Atti et al.

(10) Patent No.: US 9,503,098 B1
(45) Date of Patent: Nov. 22, 2016

(54) CURRENT-FEEDBACK OPERATIONAL AMPLIFIER-BASED SINUSOIDAL OSCILLATOR

(71) Applicant: KING FAHD UNIVERSITY OF PETROLEUM AND MINERALS, Dhahran (SA)

(72) Inventors: Muhammad Taher Abuelma'Atti, Dhahran (SA); Eyas Saleh Alsuhaibani, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 15/092,591

(22) Filed: Apr. 6, 2016

(51) Int. Cl.
  *H03B 5/20* (2006.01)
  *H03L 1/00* (2006.01)
  *H03K 4/56* (2006.01)
  *H03B 28/00* (2006.01)
  *H03K 4/71* (2006.01)

(52) U.S. Cl.
  CPC . *H03L 1/00* (2013.01); *H03B 5/20* (2013.01); *H03B 28/00* (2013.01); *H03K 4/56* (2013.01); *H03K 4/71* (2013.01)

(58) Field of Classification Search
  CPC .......... H03B 28/00; H03B 5/20; H03K 4/56; H03K 4/71; H03L 1/00
  USPC ............ 331/108 B, 135, 111; 327/100, 127, 327/129, 137
  See application file for complete search history.

(56) References Cited

U.S. PATENT DOCUMENTS

| | | |
|---|---|---|
| 8,264,289 B2 | 9/2012 | Chang et al. |
| 8,604,887 B1 | 12/2013 | Abuelma'atti |
| 8,854,148 B1 | 10/2014 | Abuelma'atti |
| 8,860,518 B1 | 10/2014 | Abuelma'atti et al. |
| 8,917,146 B1 | 12/2014 | Abuelma'atti et al. |
| 9,019,030 B1 | 4/2015 | Abuelma'atti et al. |
| 9,184,734 B1 * | 11/2015 | Abuelma'atti ........... H03K 7/08 |

OTHER PUBLICATIONS

Senani, Bhaskar, Singh, and Sharma "*Sinusoidal Oscillators and Waveform Generators using Modern Electronic Circuit Building Blocks*", p. 262, Springer International Publishing (2016).

* cited by examiner

*Primary Examiner* — Arnold Kinkead
(74) *Attorney, Agent, or Firm* — Richard C. Litman

(57) ABSTRACT

The current-feedback operational amplifier-based sinusoidal oscillator circuit includes a pair of CFOAs connected to each other using five resistors and two capacitors. The condition and the frequency of oscillation are fully coupled, and thus none of them can be controlled without disturbing the other. The oscillator circuit provides a high impedance output current and two low impedance output voltages.

4 Claims, 2 Drawing Sheets

CURRENT-FEEDBACK OPERATIONAL AMPLIFIER-BASED SINUSOIDAL OSCILLATOR

BACKGROUND OF THE INVENTION

1. Field of the Invention

The present invention relates to oscillator circuits, and particularly to a current-feedback operational amplifier-based sinusoidal oscillator circuit that can provide a high impedance output current and two low impedance output voltages.

2. Description of the Related Art

Since its inception, the current-mode approach for analog signal processing, where the input and output signals are currents rather than voltages, has received considerable attention.

This is attributed to the simple structure of the current-mode analog building blocks and the consequent results of low power supply requirement, low power consumption, and high frequency operation compared to the voltage-mode counterparts.

On the other hand, sinusoidal oscillators are among the basic circuits used in analog signal processing. They are widely used in communication systems, instrumentation, measurement and control. Of particular interest here are sinusoidal oscillators providing an explicit current output.

These oscillators would be useful as signal generators for current-mode active filters and bridges, and for testing various current-mode circuits. Over the years, researchers have developed a large number of current-mode sinusoidal oscillator circuits with explicit current output using various commercially available and unavailable current-mode analog building blocks. What is needed is a sinusoidal oscillator circuit having a simple structure resulting in wider frequency span, high slew rate, flexible gain-bandwidth product, and relatively large dynamic range.

Thus, a current-feedback operational amplifier-based sinusoidal oscillator solving the aforementioned problems is desired.

SUMMARY OF THE INVENTION

The current-feedback operational amplifier-based sinusoidal oscillator circuit includes a pair of CFOAs connected to each other using five resistors and two capacitors. The condition and the frequency of oscillation are fully coupled, and thus, none of them can be controlled without disturbing the other.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
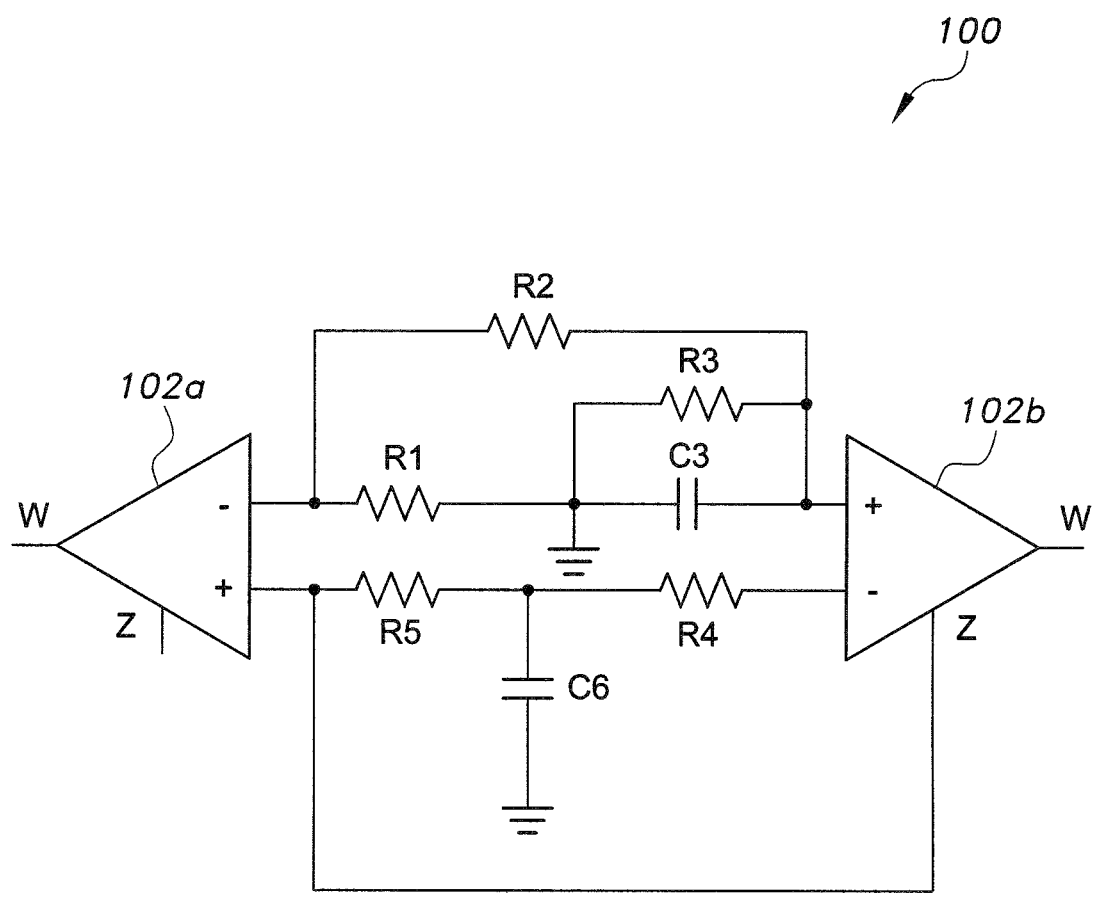
FIG. 1 is a schematic diagram of a current-feedback operational amplifier-based sinusoidal oscillator according to the present invention.

The current-feedback operational amplifier (CFOA)-based sinusoidal oscillator circuit includes a pair of CFOAs connected to each other using five resistors and two capacitors. FIG. 1 shows the present current-mode sinusoidal oscillator 100 with output current/voltage. A first lead of a first resistor R1 is connected in series with the parallel RC circuit R3, C3. A second lead of first resistor R1 is connected to the negative (inverting) terminal of a first CFOA 102a. The parallel RC circuit R3, C3 is connected to the positive (non-inverting) terminal of a second CFOA 102b. The junction of parallel RC circuit R3, C3 and R1 is connected to ground. First and second leads of a third resistor R2 are connected to the negative (inverting) terminal of the first CFOA 102a and the positive (non-inverting) terminal of second CFOA 102b, respectively, therefore being in parallel with the series circuit including R1 and the parallel R3, C3 circuit. A first lead of a fourth resistor R4 is connected to the negative (inverting) terminal of the second CFOA 102b. The second lead of the fourth resistor R4 is connected in series with a fifth resistor R5. The fifth resistor R5 is connected to the positive (non-inverting) terminal of the first CFOA 102a. A second capacitor C6 is connected between the junction of the fourth resistor R4 and the fifth resistor and ground. The Z-terminal (slewing terminal) of the second CFOA 102b is connected to the positive (non-inverting) terminal of the first CFOA 102a.

Assuming ideal CFOAs with $i_z=i_x$, $v_x=i_y=0$, and $v_w=v_z$, routine analysis yields the following characteristic equation:

$$s^2 G_5 C_3 C_6 + s(C_6 G_5(G_2+G_3) + 2C_3 G_4 G_5 - C_6 G_2 G_4) + 2G_3 G_4 G_5 = 0. \quad (1)$$

Using the Barkhausen criterion, the frequency and condition of oscillation can be expressed as $$\omega_0^2 = \frac{2G_3 G_4}{C_3 C_6} \quad (2)$$

and $$C_6 G_2 G_4 = 2C_3 G_4 G_5 + C_6 G_5(G_2+G_3) \quad (3)$$

In equations (1)-(3), $G_i=1/R_i$, i=1, 2, ..., 5.

Inspection of equations (2) and (3) shows that the condition of oscillation can be controlled without disturbing the frequency of oscillation. However, the latter cannot be controlled without disturbing the former. Thus, the circuit enjoys orthogonal tuning. Moreover, it is obvious that the resistance $R_1$ (R1 as shown in FIG. 1) is not involved in determining either the frequency or the condition of oscillation. However, R1 can be used to control the current in the x-terminal of the first CFOA 102a, and thus can control the output current of the first CFOA.

The predictions based on the use of the Barkhausen criterion are questionable. A better prediction can be obtained by finding the roots of the characteristic equation (1). These two roots are given by:

$$s_{1,2} = \frac{-b \pm \sqrt{b^2 - 4ac}}{2a}, \quad (4)$$

where $a=C_3 C_6 G_5$, $b=C_6 G_5(G_2+G_3)+2C_3 G_4 G_5 - C_6 G_2 G_4$, and $c=2G_3 G_4 G_5$. Using equation (4), the condition and the frequency of oscillation can be expressed as:

$$C_6 G_5(G_2+G_3) + 2C_3 G_4 G_5 < C_6 G_2 G_4 \quad (5)$$

$$4ac > b^2 \quad (6)$$

and $$\omega = \frac{\sqrt{4ac - b^2}}{2a}. \quad (7)$$

Inspection of equations (5), (6), and (7) clearly shows that in contrast with the predictions based on the Barkhausen criterion, the condition and the frequency of oscillation are fully coupled, and thus none of them can be controlled without disturbing the other. The W-terminals of CFOA 102a and CFOA 102b provide two low impedance output voltages, while the Z-terminal (stewing terminal) of CFOA 102a provides a high impedance output current.

Figure 2:
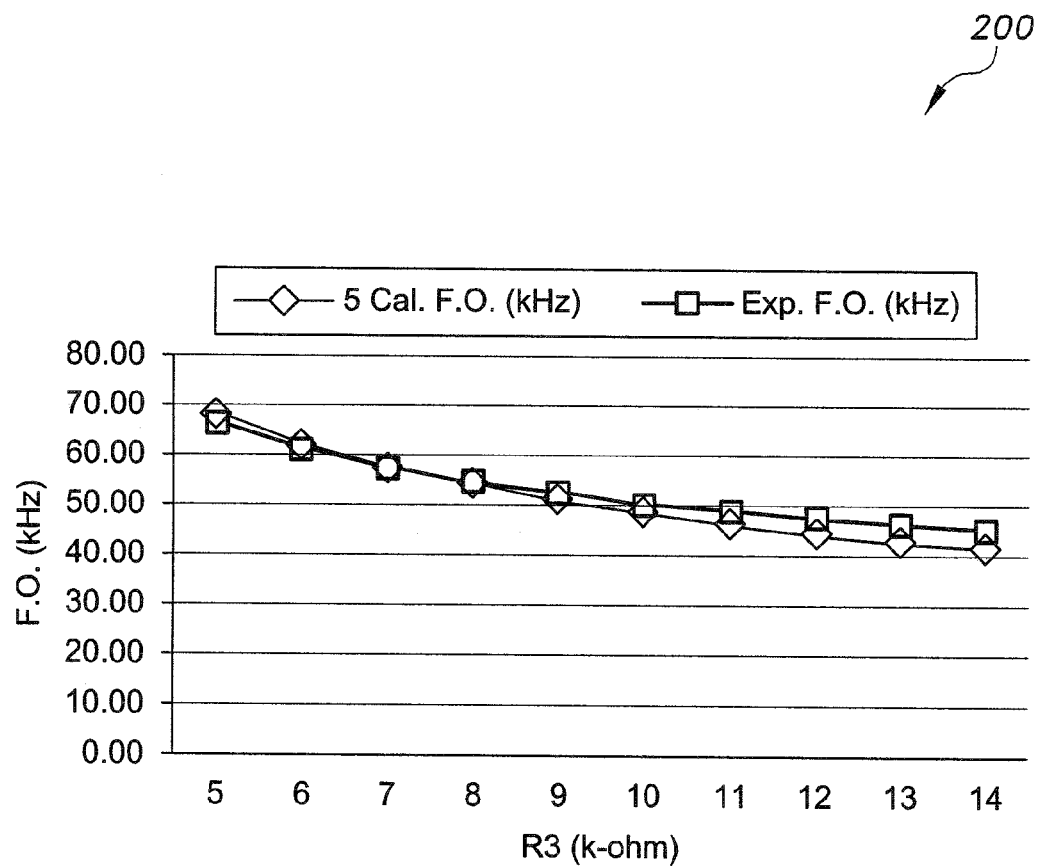
FIG. 2 is a plot showing variation of the frequency of oscillation as a function of the resistance of R3 in a current-feedback operational amplifier-based sinusoidal oscillator according to the present invention.

The proposed circuit 100 of FIG. 1 was experimentally tested using AD844 CFOAs with R1=1.5 kΩ, R2=R4=2.2 kΩ, R5=8.06 kΩ, C3=C6=1.0 nF, and DC supply voltage=±9V. Typical results are shown in plot 200 of FIG. 2.

It is to be understood that the present invention is not limited to the embodiments described above, but encompasses any and all embodiments within the scope of the following claims.

We claim:

1. A current-feedback operational amplifier-based sinusoidal oscillator, comprising:
   a first current feedback operational amplifier (CFOA) having inverting, non-inverting, W- and Z-terminals;
   a second CFOA having inverting, non-inverting, W- and Z-terminals, the Z-terminal of the second CFOA being connected to the non-inverting terminal of the first CFOA;
   a parallel RC circuit (R3, C3);
   a first resistor (R1) connected in series with the parallel RC circuit (R3, C3) at a junction, the first resistor (R1) being connected to the inverting terminal of the first CFOA and the parallel RC circuit (R3, C3) being connected to the non-inverting terminal of the second CFOA, the junction between the first resistor (R1) and the parallel RC circuit (R3, C3) being connected to ground;
   a third resistor (R2) connected to the inverting terminal of the first CFOA and the non-inverting terminal of the second CFOA, the third resistor (R2) being in parallel with the series connection of the first resistor (R1 and the parallel RC circuit (R3, C3);
   a fourth resistor (R4) connected to the inverting terminal of the second CFOA;
   a fifth resistor (R5) connected to the non-inverting terminal of the first CFOA and connected in series with the fourth resistor (R4) at a second junction; and
   a second capacitor (C6) connected between the second junction and ground;
   wherein the sinusoidal oscillator circuit has a high impedance oscillatory output taken at the Z-terminal of the first CFOA and two low impedance oscillatory outputs taken at the W-terminal of the first CFOA and the W-terminal of the second CFOA, respectively.

2. The current-feedback operational amplifier-based sinusoidal oscillator according to claim 1, wherein the oscillator is characterized by the relation:

$$s^2 G_5 C_3 C_6 + s(C_6 G_5(G_2+G_3) + 2C_3 G_4 G_5 - C_6 G_2 G_4) + 2G_3 G_4 G_5 = 0,$$

where the first COFA the second CFOA have current and voltage relations $i_z = i_x$, $v_x = v_y$, $i_y = 0$, and $v_w = v_z$, and where $G_i = 1/R_i$, $i = 1, 2, \ldots, 5$.

3. The current-feedback operational amplifier-based sinusoidal oscillator according to claim 2, wherein roots to the relation characterized in claim 2 are characterized by:

$$s_{1,2} = \frac{-b \pm \sqrt{b^2 - 4ac}}{2a},$$

where $a = C_3 C_6 G_5$, $b = C_6 G_5(G_2+G_3) + 2C_3 G_4 G_5 - C_6 G_2 G_4$, and $c = 2G_3 G_4 G_5$.

4. The current-feedback operational amplifier-based sinusoidal oscillator according to claim 3, wherein condition and frequency of oscillation are based on $s_{1,2}$ and are characterized by the relations:

$$C_6 G_5(G_2+G_3) + 2C_3 G_4 G_5 < C_6 G_2 G_4$$

$$4ac > b^2,$$

and $$\omega = \frac{\sqrt{4ac - b^2}}{2a}.$$

* * * * *